United States Patent [19]
Moreland

[11] Patent Number: 5,413,477
[45] Date of Patent: May 9, 1995

[54] STAGED AIR, LOW NOX BURNER WITH INTERNAL RECUPERATIVE FLUE GAS RECIRCULATION

[75] Inventor: Donald P. Moreland, Hershey, Pa.

[73] Assignee: Gas Research Institute, Chicago, Ill.

[21] Appl. No.: 166,449

[22] Filed: Dec. 13, 1993

Related U.S. Application Data

[63] Continuation-in-part of Ser. No. 964,550, Oct. 16, 1992, Pat. No. 5,269,679.

[51] Int. Cl.⁶ ............................................. F23M 3/00
[52] U.S. Cl. ...................................... 431/9; 431/116; 431/190; 431/351; 431/164
[58] Field of Search ..................... 431/115, 116, 9

[56] References Cited

U.S. PATENT DOCUMENTS

| | | |
|---|---|---|
| 1,342,901 | 6/1920 | Good . |
| 1,911,177 | 5/1933 | Beck . |
| 2,002,448 | 5/1935 | Dodge . |
| 3,097,686 | 7/1963 | Morrow . |
| 3,730,668 | 5/1973 | Iida et al. ............... 431/10 |
| 3,868,211 | 2/1975 | Haye et al. ............. 431/10 |
| 3,890,088 | 6/1975 | Ferri ....................... 431/351 |
| 3,990,831 | 11/1976 | Syska ....................... 431/9 |
| 4,007,001 | 2/1977 | Schirmer ................. 431/10 |
| 4,021,188 | 5/1977 | Yamagishi et al. ..... 431/158 |
| 4,083,677 | 4/1978 | Hovis ....................... 432/19 |
| 4,445,842 | 5/1984 | Syska ...................... 431/115 |
| 4,500,281 | 2/1985 | Beardmore .............. 431/3 |
| 4,504,211 | 3/1985 | Beardmore .............. 431/3 |
| 4,629,413 | 12/1985 | Michelson et al. ..... 431/9 |
| 4,797,087 | 1/1989 | Gitman .................... 431/10 |
| 4,800,866 | 1/1989 | Finke ....................... 126/91 A |
| 4,828,483 | 5/1989 | Finke ....................... 431/11 |
| 4,900,246 | 2/1990 | Schirmer et al. ....... 431/452 |
| 4,942,832 | 7/1990 | Finke ....................... 110/190 |
| 4,995,807 | 2/1991 | Rampley et al. ........ 431/9 |
| 5,015,174 | 5/1991 | Dreizler et al. ......... 431/116 |
| 5,044,931 | 9/1991 | Van Eerden et al. ... 431/8 |
| 5,044,932 | 9/1991 | Martin et al. ........... 431/116 |
| 5,092,761 | 3/1992 | Dinicolantonia ....... 431/115 |
| 5,131,838 | 7/1992 | Gensler et al. ......... 431/177 |
| 5,350,293 | 9/1994 | Khinkis et al. .......... 431/116 |

*Primary Examiner*—Carroll B. Dority
*Attorney, Agent, or Firm*—Dick and Harris

[57] ABSTRACT

A gas-fired burner incorporating an air driven jet pump for mixing air, fuel, and recirculated flue gas with reduced heat loss from the recirculated flue gas is disclosed. The burner is configured for the staged introduction of combustion air to provide a fuel-rich combustion zone and a fuel-lean combustion zone. Internal flue gas channels deliver cooled flue gas to the primary fuel-rich combustion zone. A valve assembly may be provided to control the flow of flue gas. Secondary air channels concentrically arranged within the flue gas channels deliver superheated, staged air to the secondary fuel-lean combustion zone. Heat is transferred from the hot flue gas to the counterflowing cooler secondary air. The burner achieves reduced NO$_x$ emission levels in high temperature applications which use preheated combustion air with no or minimal loss in thermal efficiency from flue gas recirculation.

28 Claims, 3 Drawing Sheets

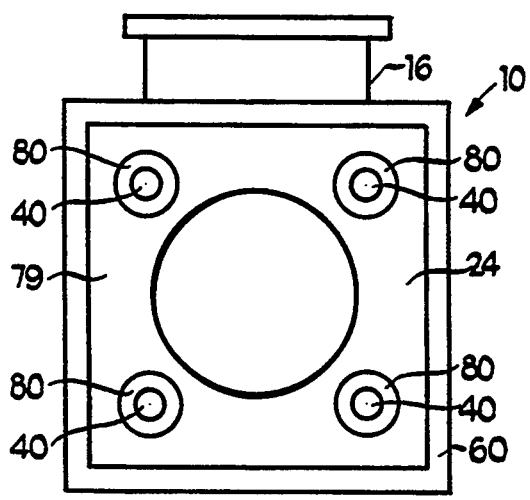
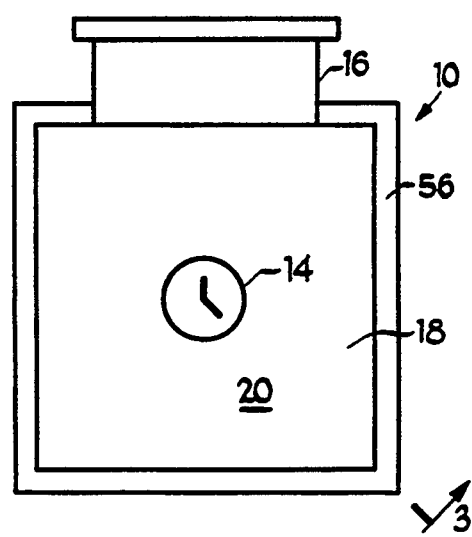
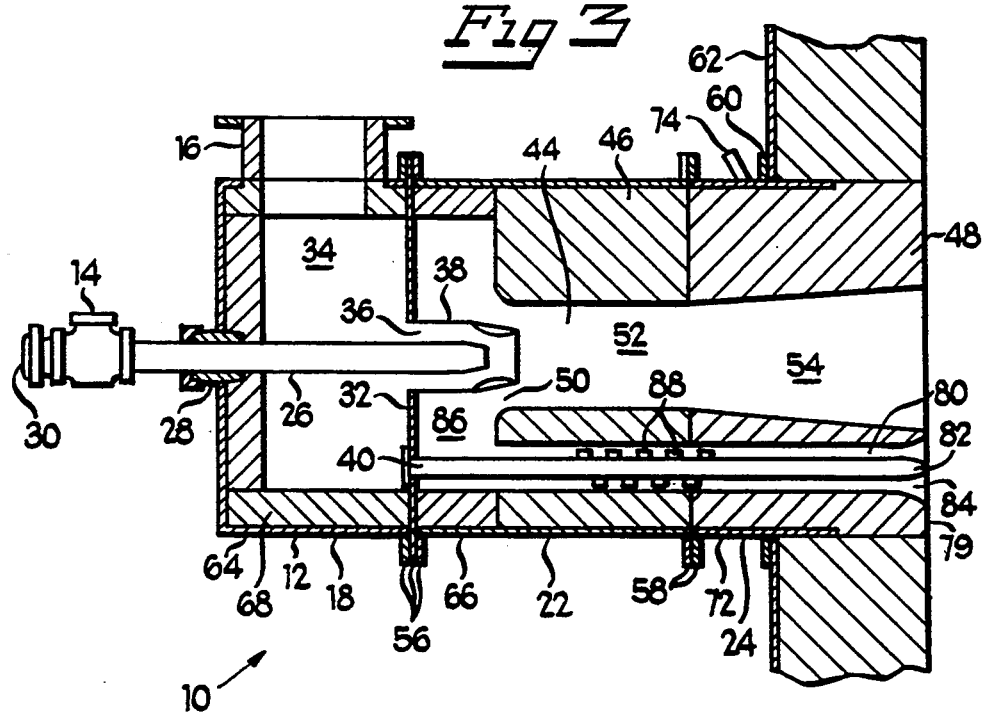

STAGED AIR, LOW NOX BURNER WITH INTERNAL RECUPERATIVE FLUE GAS RECIRCULATION

RELATED APPLICATION

This application is a continuation-in-part of application Ser. No. 07/964,550, filed Oct. 16, 1992, entitled Staged Air, Recirculating Flue Gas Low Nox Burner, now U.S. Pat. No. 5,269,679, the disclosure of which is incorporated herein by reference.

FIELD OF THE INVENTION

This invention relates to the field of gas-fired burners for furnaces and boilers and more particularly to burners for reducing $NO_x$ emission levels from combustion occurring in furnaces and boilers.

BACKGROUND OF THE INVENTION

Combustion processes which burn fossil fuels introduce emissions into the atmosphere which have been linked with harmful effects. Environmental regulations have been enacted to limit the concentrations of these emissions in the exhaust gases from combustion processes. Such emissions include nitrogen oxides or $NO_x$, primarily NO and $NO_2$. Preferably, $NO_x$ emission levels should be significantly below 100 parts per million (ppm).

$NO_x$ emissions arise from nitrogen present in the combustion air and from fuel-bound nitrogen in coal or fuel oil if such fuels are burned. Conversion of fuel-bound nitrogen to $NO_x$ depends on the amount and reactivity of the nitrogen compounds in the fuel and the amount of oxygen in the combustion zone. Conversion of fuel-bound nitrogen is not present in processes using fuels such as natural gas, which contain no fixed nitrogen compounds.

Conversion of atmospheric nitrogen, $N_2$, present in the combustion air to $NO_x$ (thermal $NO_x$) is temperature dependent. In general, the greater the flame temperature in the combustion zone, the greater the resultant $NO_x$ content in the emissions. $NO_x$ conversion increases substantially at temperatures greater than 1800K if $O_2$ is present.

Many industrial processes, such as forging, reheating, steel blooms, and melting of glass or aluminum, are carried out in high temperature, gas-fired furnaces. In such high temperature processes, air used in the combustion process is frequently preheated. Preheating the air reduces the amount of fuel needed, increasing thermal efficiency, but increases the temperature of the flame, which increases $NO_x$ content. Thus, a higher temperature burner which is capable of reducing $NO_x$ emissions without sacrificing thermal efficiency is needed.

One way of reducing $NO_x$ content which has been effective in processes using nitrogen bearing fuels is to create a fuel-rich combustion zone followed by a fuel-lean combustion zone. This can be achieved by staging the introduction of air into the combustion chamber. The fuel-rich zone contains less than the theoretical or stoichiometric amount of oxygen. Thus, less oxygen is available to convert the nitrogen to $NO_x$.

Recirculating flue gas into the flame is another technique to limit $NO_x$ emissions. The recirculated flue gas reduces the oxygen concentration in the reactants and reduces the flame temperature by cooling the combustion products, thereby lowering $NO_x$ content. Additionally, $NO_x$ present in the recirculated flue gas can be further destroyed by reburning.

External ducting is typically provided from the furnace to the burner for recirculation of the flue gas. The flue gas is hot and accordingly heat is lost from the system as the gas passes along the ducting. The hot flue gases are sometimes used for other purposes, such as preheating the combustion air or vaporizing liquid fuels. This minimizes, but does not eliminate, the heat losses from the system.

Steel reheat furnaces, in which steel is heated to temperatures at which it can be plastically deformed by forging or rolling, are particularly suitable for the retrofitting of burners which utilize flue gas recirculation. Temperatures in these furnaces typically reach 1450K or greater, which makes the use of recuperators for preheating combustion air or regenerative burners cost effective. However, the external flue gas ducting of prior art burners, which incorporate flue gas recirculation, can render the retrofitting of such burners to an existing furnace difficult and costly. Moreover, the recirculation of cooled flue gas to the combustion zone reduces the thermal efficiency of the process.

SUMMARY OF THE INVENTION

In the present invention, a low $NO_x$, natural gas-fired burner for high temperature applications incorporating internal flue gas recirculation is provided which minimizes heat loss from the system due to the recirculating flue gases. The burner incorporates an air driven jet pump for mixing air, fuel, and recirculated flue gas and for forcing the mixture into the combustion chamber. The burner includes an air inlet port which connects with a primary air passage for supplying combustion air to the jet pump and to provide a fuel-rich combustion zone. The burner further includes secondary air passages to provide a fuel-lean combustion zone downstream of the fuel-rich zone.

Flue gas recirculation channels are formed internally of the burner housing in the refractory material comprising the body of the jet pump. The channels are outwardly spaced from the mixing chamber and diffuser of the jet pump and extend from an entrance at the furnace wall of the burner to an opening near the suction chamber of the jet pump. The jet pump induces a flow of flue gas from the furnace into the burner.

The secondary air channels comprise a pipe concentrically arranged within each flue gas recirculation channel. As the flue gas flows through the channel into the burner, the secondary air flows in an oppositely directed counterflow through the pipe into the furnace. Most of the heat lost from the flue gas is transferred to the secondary air in the concentric pipe and thereby remains in the system. Heat transfer fins may additionally be provided on the secondary air pipe to aid in the heat transfer.

Typically, a plurality of flue gas channels each having a secondary air pipe concentrically arranged therein is provided. In one embodiment, the burner housing is formed with a square cross section and four flue gas channels are located circumferentially about the jet pump body in a symmetrical arrangement. The provision of internal flue gas channels optimizes the use of the furnace wall area available for interfacing with the burner and aids in the retrofitting of flue gas recirculation burners to existing furnaces.

DESCRIPTION OF THE DRAWINGS

The invention will be more fully understood from the following detailed description taken in conjunction with the accompanying drawings in which:

FIG. 1 is an end view of a burner according to the present invention;

FIG. 2 is a view of the opposite end of the burner of FIG. 1;

FIG. 3 is a cross-sectional view along the line III—III of FIG. 1;

DETAILED DESCRIPTION OF THE INVENTION

Figure 4:
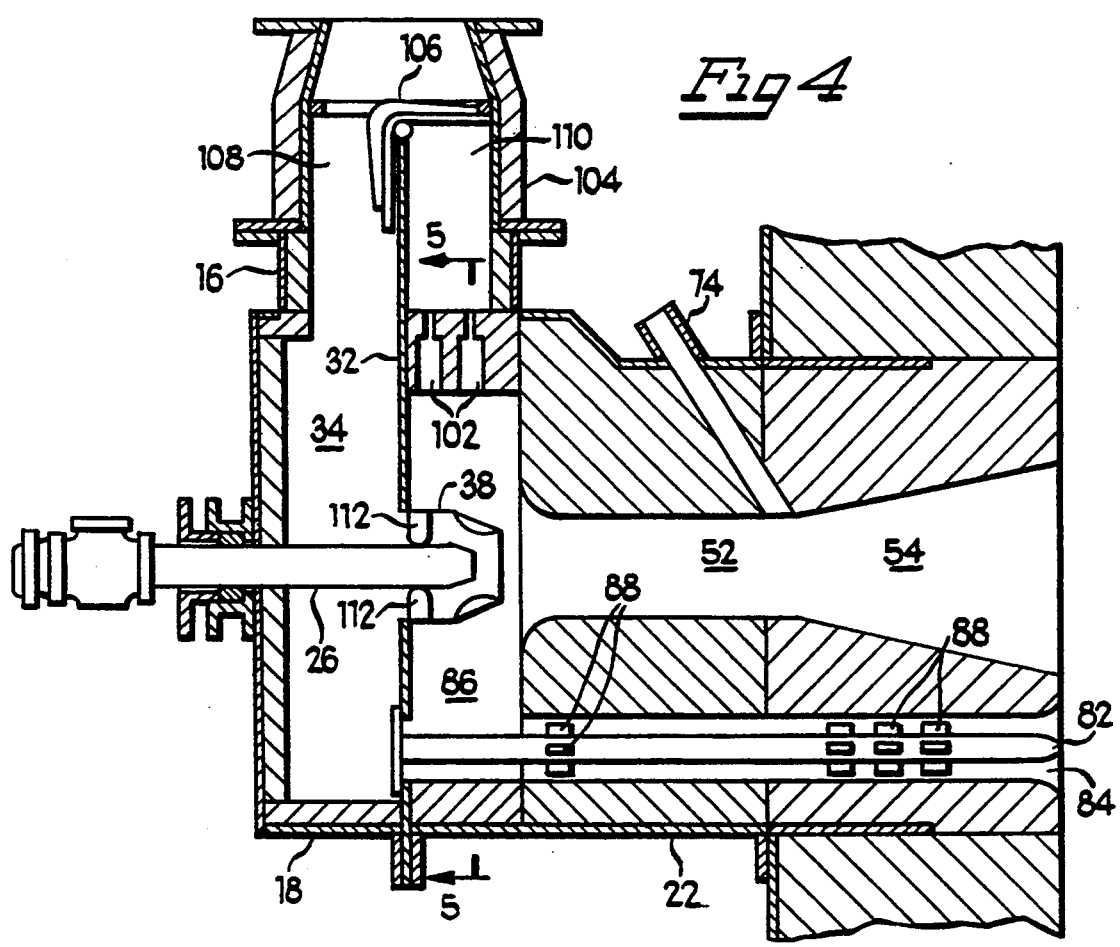
FIG. 4 is a cross-sectional view of a further embodiment of a burner according to the present invention.

A burner according to the present invention which reduces heat loss due to flue gas recirculation is shown generally at 10 in FIGS. 1 through 3. The burner comprises a housing 12, a gaseous fuel connection 14, and an air inlet connection 16. The housing comprises an end section 18 including an end wall 20, a mid section 22, and a burner block or quarl section 24. A fuel inlet nozzle 26 extends from the fuel connection 14 into the housing 12 through an opening in the housing end wall 20. A fitting 28 is provided to seal the opening. An observation port 30 is provided at the fuel connection 14. The fuel inlet nozzle passes through a further opening in a wall 32 of the mid section to terminate within the mid section.

The air inlet 16 communicates with an air chamber 34 in the end section 18 which surrounds the fuel inlet nozzle 26. The air chamber 34 communicates through an annularly spaced opening 36 in the wall of the mid section with a primary air nozzle 38 concentrically arranged about the portion of the fuel inlet nozzle 26 in the mid section 22. The air chamber 34 also communicates with a plurality of secondary air passages 40, to be more fully described below.

A jet pump 44 is formed within the mid section 22 and burner block section 24 of the housing 12. The jet pump 44 comprises a jet pump body 46, 48 defining a frustoconical suction chamber 50, a cylindrical mixing chamber 52, and a frustoconical diffuser 54. The frustoconical diffuser, which is located within the burner block section 24, also serves as a combustion chamber, to be more fully described below.

The end section 18 and mid section 22 are interconnected in any suitable manner, such as by bolted annular flanges 56. The mid section 22 and burner block section 24 may be similarly interconnected by bolted flanges 58. An annular flange 60 is provided on the burner block section 24 for interconnection to a furnace wall 62, shown in FIG. 3. The sections of the housing may also be interconnected in any other suitable manner. Similarly, the burner housing may be connected to the furnace in any other suitable manner.

The end section 18 and mid section 22 are preferably fabricated from a casing 64, 66 of a material such as carbon steel or cast iron and lined with insulating refractory material 68. The jet pump body section 46 defining the suction chamber 50 and the mixing chamber 52 are also contained within the casing 66. The burner block section 24 comprises a casing 72 housing the jet pump body portion 48 which defines the diffuser 54. The jet pump body is preferably fabricated from a high temperature refractory material. Although the jet pump body is shown in FIG. 3 as formed in two sections, it may be formed as a single unitary body or from a different number and configuration of sections if desired. A pilot light opening 74 and a scanner opening (not shown) are formed in the refractory material 48 surrounding the diffuser 54.

Secondary air passages 40 is formed from a tube or pipe extending from the wall 32 of the mid section 22 to a furnace wall 79 of the burner block section 24 at the furnace. Each tube is concentrically arranged within a channel 80 formed in the refractory material comprising the jet pump body 46, 48 through both the mid and burner block sections 22, 24. Each secondary air tube terminates at a nozzle 82 for directing a higher velocity flow of the secondary air into the furnace.

The channels 80 concentrically surrounding the secondary air passages 40 each terminate at an annular opening 84 in the furnace surrounding the secondary air nozzles 82. Each channel 80 through the jet pump body is wider than the secondary air passage 40 and forms a passage for recirculation of flue gas from the furnace. The annular opening 84 may be formed with a diverging configuration as shown in FIG. 3 to provide greater access of the flue gas in the furnace to the channel. The flue gas passage terminates at an open area 86 in the mid section 22 for communication with the suction chamber 50. The suction in the suction chamber created by the jet pump induces a flow of flue gas from the furnace back into the burner.

The heat transfer from the hot flue gas to the cooler secondary air may be facilitated by provision of heat transfer fins 88 welded or otherwise secured to the exterior of each secondary air passage 40. The fins increase the surface area available for convective heat transfer from the hot flue gas to the secondary air passage, thereby increasing the rate of heat transfer to the secondary air. The heat transfer from the flue gas to the secondary air is typically enough to superheat the secondary air. In this manner, the secondary air is efficiently preheated before entry into the furnace, and the heat in the flue gas which would otherwise be lost to the system is returned to the furnace. In a typical steel reheating furnace, the furnace temperature is approximately 1480K and the preheated secondary air entering the furnace is at a temperature of approximately 850K.

The burner is shown in FIG. 1 with a square shape in cross-section. Four flue gas channels are provided, disposed in each corner of the burner. However, any cross-sectional shape and number of flue gas channels may be provided, as desired by the application. For example, the burner may have a circular cross-section, which is more evenly insulated than a square or rectangular burner. Similarly, the burner may be any suitable size. If the burner is intended to retrofit an existing furnace, the particular shape and size may be determined by the existing furnace wall opening.

In operation, air is forced under pressure through the air inlet 16 into the chamber 34. For high temperature applications, the air has typically been preheated to the range of 600 to 800K prior to its introduction to the burner. In a typical steel reheating furnace, the air has been preheated to approximately 650K. A primary air stream enters through the opening 36 into the primary air nozzle 38 and flows through the nozzle into the suction chamber 50. Air flowing through the nozzle experiences a pressure drop. Natural gas fuel, entering through the fuel nozzle 26, concentric with the air nozzle, also experiences a pressure drop. In flowing through the nozzles and suction chamber, the lower pressure air and natural gas fuel induce a flow of flue gas from the furnace through the channels 80 into the suction chamber 50. The flue gas opening area 86 may be connected radially or tangentially to the suction chamber 50. A tangential connection imparts a spiral motion to the flue gas stream as it enters the primary air/fuel stream, which under hot operating conditions aids in maintaining flame stability.

Under some conditions, such as a cold start-up or when a large furnace door has been opened, which may reduce the effective furnace temperature for several minutes, the jet pump may pull in more flue gas than can be tolerated by the flame retaining qualities of the burner. In this case, it may be desirable to limit the flue gas recirculation, as discussed more fully below, until the combustion air has reached the design preheat temperature and the furnace temperature has gained a desired temperature, generally 1050K.

Referring again to FIG. 3, the primary air and natural gas stream flows through the suction chamber 50 into the mixing chamber 52. The primary air, fuel, and flue gas mix in the mixing chamber 52. The mixture generally recovers some pressure in the mixing chamber 52 and exits the mixing chamber 52 at a slightly increased pressure. The mixed primary air, fuel, and flue gas then enter the diffuser 54 which has an increasing cross sectional area, by virtue of the frustoconical shape, to decrease the velocity and increase the pressure up to the pressure in the furnace. However, if the included angle of the diffuser becomes too large, the flow will break away into eddies, rather than expand. An included angle of approximately 18° has been found to be suitable. A pilot flame provided through tube 74 ignites the air and fuel mixture in the diffuser. The combustion can be observed through the scanner tube, which is located in a manner similar to tube 74.

From the air chamber 34, the secondary air stream enters the plurality of passages 40 concentrically arranged with each flue gas channel 80 and passes through to the furnace, where it enters the periphery of the flame envelope, which extends from the diffuser 54 into the furnace. Thus, due to the division of the combustion air, a fuel-rich primary combustion zone exists in the flame in and immediately outside the diffuser, which receives less than the theoretical amount of air, and a fuel-lean secondary combustion zone exists in the flame which extends into the furnace. The flame in and immediately outside the diffuser 54 may also be described as the primary flame, the flame in the furnace as the secondary flame.

The velocity of the secondary air entering the furnace is generally much higher than the velocity of the flue gases within the furnace. For example, the secondary air velocity is typically in the order of 330 fps, while the flue gas velocity is in the order of 20 fps. The entering secondary air creates a flue gas recirculation pattern within the furnace such that the flow of furnace gases toward the secondary air jets may even enhance the entrance of these gases into the flue gas recirculating channels 80, where they are readily induced by the low pressure created by the jet pump within the burner.

In fuel-rich hydrocarbon flames, the source of NO is the fixation of $N_2$ by hydrocarbon fragments, in reactions such as:

$$CH + N_2 \rightarrow HCN + N \text{ and}$$

$$CH_2 + N_2 \rightarrow HCN + NH.$$

N from the first reaction can then participate in the following fast reaction:

$$N + OH \rightarrow NO + H$$

The products HCN and NH will be partially converted in the fuel-rich flame to molecular nitrogen, $N_2$, provided that the temperature is at least 1400K and there is sufficient residence time for these reactions to go to completion. The NO formed by the reaction of $N_2$ with hydrocarbon radicals or introduced with the flue gases can also be converted back to $N_2$ through a "reburn" route in the fuel-rich flame. This process is initiated by reactions producing HCN, for example, $$CH + NO \rightarrow HCN + O.$$

The HCN further reacts to form $N_2$ at a rate that is dependent upon the fuel equivalence ratio and the temperature of the fuel-rich flame zone.

Under lean conditions, NO is formed primarily by the Zeldovich mechanism. Thus, reducing flame temperature in the lean stage effectively controls the NO formation rate. Flame temperature is reduced by the entrained flue gases which introduce inert substances into the secondary combustion zone and absorb a fraction of the energy released as combustion is completed in the fuel lean zone. The flue gases introduce principally $N_2$, $H_2O$, and $CO_2$ into the combustion zone. All of these species absorb energy while being reheated to flame temperature. The process may be even more effective if some of the molecules of $CO_2$ and $H_2O$ dissociate as they are heated to high temperatures.

For most flue gas recirculation applications, the amount of combustion products that can be recycled is limited by the need to preserve flame stability. However, the jet pump configuration of the burner of the present invention introduces the fuel and primary air into the fuel-rich zone in a manner that extends the amount of recyclable flue gas which can be introduced before flame instability occurs. In the present invention, when the burner is running at its typical hot operating temperatures, flue gas recirculation is limited by the capacity of the jet pump more so than flame stability. As discussed more fully below, the flue gas recirculation may be limited if desired under certain conditions, such as cold start-up.

In the fuel-lean zone, thermal NO formation is also reduced by the introduction of the secondary air jets 82 from the secondary air passages. The combustible products of the fuel-rich flame are intercepted in the furnace by the secondary air jets, which entrain burned and cooled combustion products before they mix with the products of the fuel-rich flame and burn as a secondary flame. In this mode of combustion, the peak temperature of the flame and the $O_2$ concentration are reduced, resulting in reduced thermal $NO_x$ formation.

Actual burner geometry and process parameters for a burner according to the present invention depend on the particular application. The predetermined input or design parameters include the percent excess combustion air, fraction of primary air, and percent of recirculated flue gas. The furnace conditions will determine the required diffuser exit velocity and pressure. Both of these parameters affect the pressure drop through the primary air nozzle. Other parameters determined by the application are the combustion air temperature, the flue gas temperature, and the fuel gas flow and temperature.

Important process and burner geometry parameters which are determined by the input parameters include the pressure drops through and diameters of the primary and secondary air nozzles and the diameter of the mixing chamber. The pressure drop through the primary air nozzle affects the ability of the jet pump to pull in the fuel and flue gas. The greater the pressure drop through the air nozzle 38, the greater the suction created for pulling in the fuel and flue gas. Reducing the pressure drop through the air nozzle reduces the suction, which reduces the ability to pull in the fuel and flue gas. With higher flue gas recirculation rates, a greater pressure drop is required. However, the supply of air is generally fixed. If the combustion air is staged into primary and secondary air flows, the amount of primary air is reduced, which reduces the pressure drop and the amount of flue gas which can be pulled in. Thus, the effectiveness of the jet pump is reduced. In general, if the primary air is less than about 40 percent of the total combustion air, it is difficult to drive the jet pump. Therefore, the primary air nozzle diameter and mixing chamber must be carefully sized to optimize the efficiency of the jet pump based upon the predetermined primary air fraction, percent of flue gas recirculation, and furnace conditions. The primary air nozzle diameter is generally sized to provide a pressure drop of 6 to 40 inches of water column, depending on the primary air flow and the amount of flue gas recirculation desired. Typically, the pressure drop will range between 4 and 24 inches of water column; in some applications, the pressure in the furnace is above atmospheric pressure, and the pressure drop through the primary air nozzle accordingly needs to be greater.

The length and diameter of the flue gas channels 80 are also important parameters. These parameters should be chosen to minimize the pressure drop through the flue gas channels within the design constraint of the amount of flue gas to be recirculated. The length and diameter of the flue gas channels and the diameter of the secondary air channels are also chosen to effect the desired rate of heat transfer to the secondary air. Typically, the mass flow rates of secondary air and flue gas will be approximately equal. The secondary air rate will be 40 percent of the total combustion air rate and the flue gas flow rate will equal 30 to 40 percent of the total combustion air rate. Secondary air jet velocities of 250 to 400 fps require nozzle pressure drops in the range of 5.0 to 12.0 inches water column. For good convection heat transfer inside the secondary air channels, they should be sized for 125 to 200 fps at the air inlet end. The flue gas channels should be sized for a maximum pressure loss of 0.5 to 1.0 inches water column.

The individual diameters and the radial spacing of the secondary air passages 40 are also important parameters. Typically, the secondary air passage exits are sized to produce a secondary air exit velocity between 150 and 400 actual feet per second and preferably between 200 and 350 actual feet per second. The closer the radial spacing of the secondary air passages is to the exit diameter of the diffuser 54, the more effective the penetration of the secondary air jets into the secondary flame becomes and the lower the $NO_x$ emissions. Similarly, while a single secondary air passage could be provided if desired, a plurality of such passages spaced circumferentially about the diffuser is preferable. Typically, the radial displacement of the secondary air passages ranges from 1.5 to 1.8 of the exit radius of the diffuser.

Figure 5:
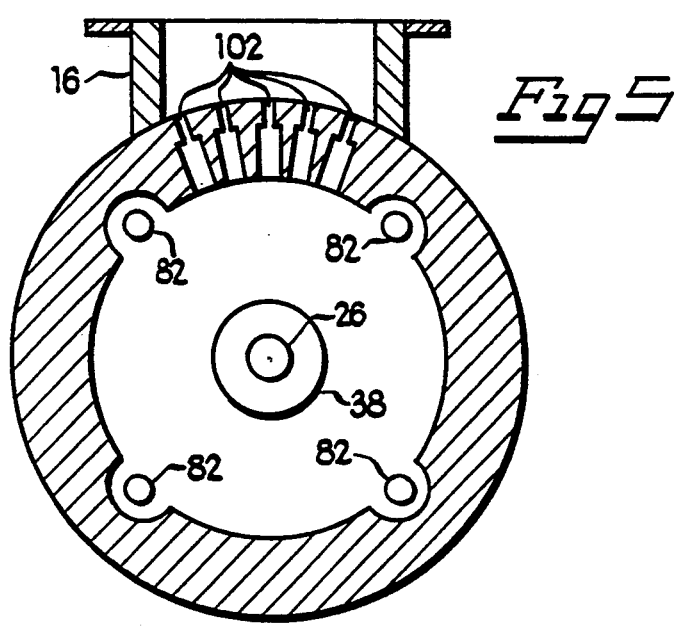
FIG. 5 is a partial cross-sectional view along line V—V of FIG. 4.

As discussed above, under some conditions, such as during a cold start-up, it is desirable to limit the amount of flue gas recirculated to the burner. A valve arrangement to accomplish this control may be provided, as shown in FIGS. 4 and 5. A plurality of throttled jets 102 may be provided within mid section 22 and the wall 32 extended into air inlet 16. The air inlet 16 may be provided to communicate with both the air chamber 34 and the throttled jets 102. An extension 104 is provided on the air inlet. A splitter valve 106 is mounted within the extension to be pivotable about an axis to alternately partially or fully close off one of two passages 108, 110 defined in the extension. The first passage 108 is in communication with the air chamber 34. The second passage 110 is in communication with the throttled jets. Centering legs 112 may be provided to support the fuel nozzle 26.

The valve is shown in the hot or run position in FIG. 4, allowing the combustion air to enter the air chamber 34 and pull in the flue gas. During times when less flue gas is desired, such as during a cold start-up, the splitter valve is pivoted to partially block off the air chamber 34 and send air through the throttled jets into the suction chamber, thereby preventing flue gas recirculation. Total burner air flow will remain essentially constant.

Figure 6:
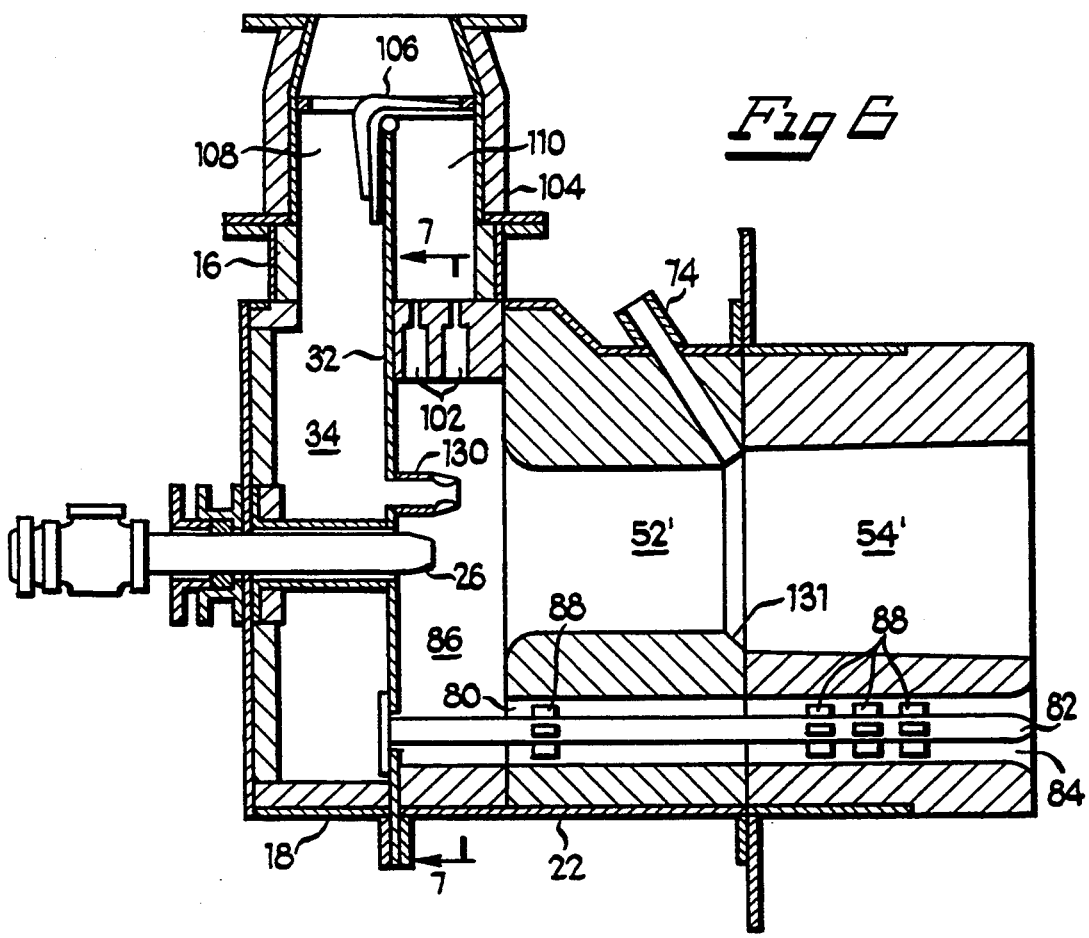
FIG. 6 is a cross-sectional view of a still further embodiment of a burner according to the present invention.
Figure 7:
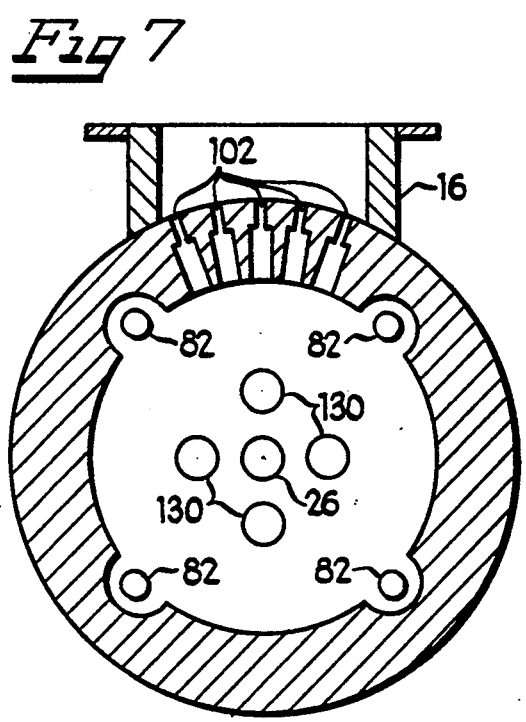
FIG. 7 is a partial cross-sectional view along the line VII—VII of FIG. 6.

The burner of the present invention may also be fitted with multiple primary air jets. For example, FIGS. 6 and 7 show a burner with flue gas recirculation control as described above but with primary or jet pump air introduced through multiple nozzles 130 displaced radially from the fuel nozzle 26 and circumferentially from the flue gas channels 80. Four nozzles are shown, but any suitable number may be used. The four multiple primary air nozzles shown require a large diameter mixing chamber 52', but provide twice the circumferential interface area as a single nozzle with the same cross-sectional area. As a result, the length of the mixing chamber 52' can be reduced as compared to that required for the single nozzle jet pump. Multiple primary air jets may provide more efficient packaging as burner size or rating becomes larger, since a single nozzle jet pump would become very long and difficult to retrofit on existing furnaces.

FIG. 6 further depicts a turbulence inducing step in diameter 131 at the interface between the mixing chamber 52' and the diffuser 54' to further enhance flame retaining qualities for those burner applications requiring continuous operation below a furnace temperature of 1050K. The use of this feature depends on the particular application, as jet pump effectiveness in recirculating flue gas to the primary combustion zone is reduced in proportion to the turbulence induced.

Figure 8:
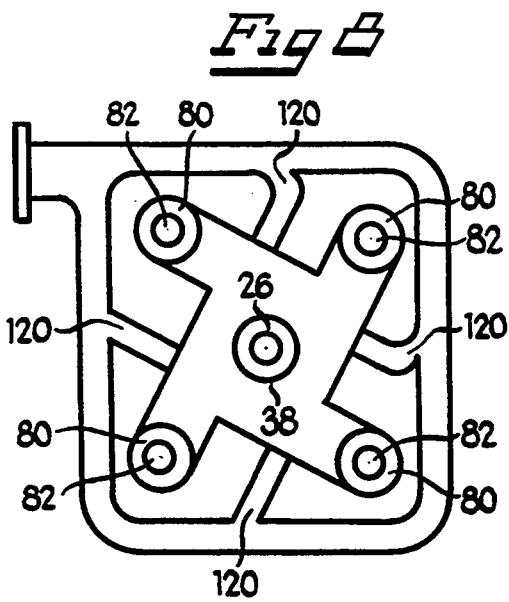
FIG. 8 is a partial cross-sectional view of a still further embodiment of a burner according to the present invention.

Other configurations for controlling the flue gas recirculation are possible. For example, as shown in FIG. 8, a plurality of cold air jets 120 may be provided, each entering adjacent a flue gas channel 80. Cold air introduced through the jets blocks the flue gas.

The burner has been described in conjunction with gaseous fuels. Axial injection of the gaseous fuel, as shown in FIG. 1, is preferable, although radial or tangential injection may be provided if desired. Radial or tangential injection ports may be provided in the suction chamber or mixing chamber. The burner may also be configured for liquid fuels, although such fuels must first be vaporized. The fuels may be vaporized by mixing with the flue gas, for example, as shown in U.S. Pat. No. 3,990,831. The burner may also be configured for liquid fuels using the multiple primary air jet embodiment of FIGS. 6 and 7 with the larger diameter mixing chamber. Either low pressure or high pressure liquid fuel atomizers may be fitted through or in place of the gaseous fuel nozle 26. The vaporized fuel may then be drawn into the air stream by the air driven jet pump along with the flue gas.

The invention is not to be limited by what has been particularly shown and described, except as indicated in the appended claims.

I claim:

1. A gas-fired burner comprising:
a housing adapted to be mounted to an opening in a furnace;
a jet pump body within said housing, said jet pump body including a jet pump defining a suction chamber, a mixing chamber, and a diffuser formed in said body, said mixing chamber being formed downstream from said suction chamber, said diffuser being formed downstream from said mixing chamber, said diffuser further having an exit for communication with the furnace, said diffuser further comprising a combustion chamber for primary zone partial combustion;
an air inlet port on said housing for supplying air under pressure to said housing;
said jet pump including a jet pump primary air nozzle within said housing interconnecting said air inlet port and said suction chamber for forcing air into said suction chamber;
a fuel inlet port on said housing and terminating in a fuel nozzle for directing fuel into said jet pump;
means forming a plurality of recirculating flue gas channels for directing flue gases from the furnace into said suction chamber, said jet body channels being spaced circumferentially about said jet pump, said flue gas channels having an entrance for communication with the furnace and an exit in communication with said suction chamber;
means forming a plurality of secondary air passages, each of said plurality of passages being disposed within a respective one of said recirculating flue gas channels, each of said secondary air passages being further connected to said air inlet port, each of said plurality of secondary air passages having an exit for communication with the furnace;
whereby air under pressure passing through said primary air passage and, in turn, through said jet pump means air nozzle and fuel gas under pressure passing through said fuel nozzle create a suction for drawing recirculating flue gas through said plurality of recirculating flue gas channels and said suction chamber and into said mixing chamber for mixing with the air and fuel to provide a fuel-rich combustion zone in said diffuser, whereby air under pressure passing through said plurality of secondary air passages mixes with the primary flame extending from said diffuser to produce a fuel-lean combustion zone in the furnace, thereby reducing $NO_x$ content, and whereby the air passing through said secondary air passages is heated by the recirculating flue gas passing through said recirculating flue gas channels.

2. The gas-fired burner of claim 1 wherein said fuel nozzle is coaxially mounted within said jet pump primary air nozzle.

3. The gas-fired burner of claim 1 wherein said air inlet port terminates in an air chamber, said air chamber surrounding said fuel nozzle.

4. The gas-fired burner of claim 1 wherein said secondary air passage exits and said diffuser exit terminate flush with an exterior wall of said housing, said exterior wall adapted to be located adjacent an interior wall of the furnace.

5. The gas-fired burner of claim 1 wherein said secondary air passage exits are sized to produce an exit velocity of the secondary air of between 50 and 300 actual feet per second.

6. The gas-fired burner of claim 5 wherein said secondary air passage exits are sized to produce an exit velocity of the secondary air of between 150 and 200 actual feet per second.

7. The gas-fired burner of claim 1 wherein said primary air passage and said jet pump primary air nozzle and said secondary air passages are sized to direct at least 40 percent of the total combustion air through said primary air passage and said jet pump primary air nozzle.

8. The gas-fired burner of claim 1 further comprising a pilot light tube extending through said housing to said diffuser to ignite an air/fuel mixture within said diffuser.

9. The gas-fired burner of claim 1 further comprising means forming an open area at the termination of each of said plurality of recirculating flue gas channels, each of said open areas in communication with said suction chamber.

10. The gas-fired burner of claim 9 wherein each of said recirculating flue gas open areas are disposed to direct flue gas tangentially into said suction chamber to produce a swirling motion of the flue gas.

11. The gas-fired burner of claim 9 wherein each of said recirculating flue gas open areas are disposed to direct flue gas radially into said suction chamber to produce a non-swirling motion of the flue gas.

12. The gas-fired burner of claim 1 wherein said jet pump primary air nozzle is sized to produce a pressure drop of 6 to 40 inches of water column.

13. The gas-fired burner of claim 1 wherein said jet pump primary air nozzle is sized to produce a pressure drop of 6 to 24 inches of water column.

14. The gas-fired burner of claim 1 wherein said jet pump primary air nozzle is sized to produce a pressure drop therethrough sufficient to draw in between 5 and 80 percent of the flue gas.

15. The gas-fired burner of claim 1 further comprising mounting members for mounting said housing to the furnace.

16. The gas-fired burner of claim 1 further comprising heat transfer elements mounted on exteriorly of said secondary air passages within said recirculating flue gas channels, whereby heat transfer from the flue gas to the secondary air is enhanced.

17. The gas-fired burner of claim 1 further comprising a valve assembly in communication with said recirculating flue gas channels to control the flow of flue gas into said suction chamber.

18. The gas-fired burner of claim 17 wherein said valve assembly comprises a valve in communication with said air inlet port, a first passage having a wide opening into said housing, and a second passage having a restricted opening into said housing, said valve disposed to alternately restrict said first passage and close said second passage.

19. The gas-fired burner of claim 18, wherein said restricted opening comprises a plurality of throttled jets.

20. The gas-fired burner of claim 18, wherein said restricted opening is sized to limit a flow of combustion air into said housing to prevent introduction of flue gas into said suction chamber.

21. The gas-fired burner of claim 1, further comprising a plurality of cold air ports each adjacent one of said plurality of flue gas channels, said cold air ports in communication with a source of cold air, whereby a flow of cold air through said cold air ports blocks introduction of flue gas through said recirculating flue gas channels.

22. The gas-fired burner of claim 1, further comprising a plurality of jet pump primary air nozzles within said housing interconnecting said air inlet port and said suction chamber for forcing air into said suction chamber.

23. The gas-fired burner of claim 22, wherein said plurality of jet pump primary air nozzles are spaced circumferentially about said fuel nozzle.

24. A method of burning gaseous fuel for high temperature applications comprising the steps of:
providing air under pressure;
introducing the air into a burner housing;
dividing the air within the housing into a primary air stream and a secondary air stream;
introducing the primary air stream through a primary air nozzle into a suction chamber;
using the air flowing through the suction chamber to draw flue gas recirculating from a furnace through a recirculating flue gas channel formed internally in the burner into a mixing chamber in which the air and fuel mix to form a fuel-rich combustible mixture;
introducing the fuel-rich combustible mixture into and through a diffuser attached to the furnace to raise the pressure of the mixture up to the pressure in the furnace for introduction of the mixture to the furnace and burning said fuel-rich combustible mixture in the diffuser and furnace to form a fuel-rich combustion zone generally within and immediately outside the diffuser;
preheating the secondary air stream by passing it adjacent the recirculating flue gas stream; and
introducing the preheated secondary air stream into the furnace to penetrate the flame extending from the diffuser to provide a fuel-lean combustion zone within the furnace.

25. The method of claim 24 further comprising the step of drawing the recirculating flue gas into the suction chamber tangentially to the suction chamber to create a swirling motion.

26. The method of claim 24 wherein at least 40 percent of the combustion air is divided into the primary air stream.

27. The method of claim 24 further comprising dividing the recirculating flue gas into a plurality of flue gas air streams circumferentially spaced about the fuel-lean combustion zone.

28. The method of claim 24 further comprising controlling the flow of flue gas into the burner housing.

* * * * *

UNITED STATES PATENT AND TRADEMARK OFFICE
CERTIFICATE OF CORRECTION

PATENT NO. : 5,413,477
DATED : May 9, 1995
INVENTOR(S) : Donald P. Moreland

It is certified that error appears in the above-indentified patent and that said Letters Patent is hereby corrected as shown below:

Col. 7 line 64                  Delete "should-be" and insert
                                -- should be --.

Col. 9 lines 48 and 49          After "chamber," delete --
                                said jet body channels being spaced
                                circumferentially about said jet
                                pump --.

Col. 12 line 8                  After burner insert -- housing --.

Col. 12 line 34                 After flue gas delete -- air --.

Signed and Sealed this

Tenth Day of October, 1995

BRUCE LEHMAN

*Attest:*

*Attesting Officer*        Commissioner of Patents and Trademarks